(12) United States Patent
Achanta

(10) Patent No.: US 10,530,339 B2
(45) Date of Patent: Jan. 7, 2020

(54) FIXED LATENCY CONFIGURABLE TAP DIGITAL FILTER

(71) Applicant: Schweitzer Engineering Laboratories, Inc., Pullman, WA (US)

(72) Inventor: Srinivas Achanta, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 419 days.

(21) Appl. No.: 15/435,468

(22) Filed: Feb. 17, 2017

(65) Prior Publication Data

US 2018/0238956 A1 Aug. 23, 2018

(51) Int. Cl.
*H03H 17/02* (2006.01)
*H04L 1/00* (2006.01)
*G06F 1/00* (2006.01)

(52) U.S. Cl.
CPC .................................. *H03H 17/026* (2013.01)

(58) Field of Classification Search
CPC ......... H04L 1/00; H04L 2201/00; G06F 1/00; G06F 2101/00
See application file for complete search history.

(56) References Cited

U.S. PATENT DOCUMENTS

| 5,150,318 | A | * | 9/1992 | Kontani | H03H 17/0219 |
| | | | | | 708/300 |
| 5,345,409 | A | * | 9/1994 | McGrath | G01R 21/133 |
| | | | | | 702/190 |
| 5,648,987 | A | * | 7/1997 | Yang | H04N 5/211 |
| | | | | | 375/232 |
| 6,760,451 | B1 | * | 7/2004 | Craven | H03G 5/005 |
| | | | | | 381/59 |
| 2012/0027128 | A1 | * | 2/2012 | Foote | H03H 17/0248 |
| | | | | | 375/316 |
| 2015/0103961 | A1 | * | 4/2015 | Malipatil | H04L 7/0016 |
| | | | | | 375/355 |
| 2016/0094240 | A1 | * | 3/2016 | O'Shaughnessy | ............... |
| | | | | | H03H 17/0664 |
| | | | | | 341/123 |

* cited by examiner

*Primary Examiner* — Huy Q Phan
*Assistant Examiner* — Temilade S Rhodes-Vivour
(74) *Attorney, Agent, or Firm* — Justin K. Flanagan

(57) ABSTRACT

A fixed latency configurable tap or fixed-tap digital filter may filter a signal in a fixed amount of time, regardless of the number of taps. The filter may include one or more of a clock, a plurality of registers in a shift register, an adder, an accumulator, and/or a scaler. In at least one embodiment, a running average may be maintained as samples are received such that the latency remains fixed with a constant number of clock cycles.

17 Claims, 9 Drawing Sheets

| Sample Number | Y[n] | Description |
|---|---|---|
| 1 | x[n]/L | |
| 2 | (x[n]+x[n-1])/L | |
| 3 | (x[n]+x[n-1]+x[n-2])/L | |
| 4 | (x[n]+x[n-1]+x[n-2]+x[n-3]-x[n])/L | Filter has primed, the bolded values cancel out resulting in the average. |
| 5 | (x[n-1]+x[n-2]+x[n-3]+x[n-4]-x[n-1])/L | |
| 6 | (x[n-2]+x[n-3]+x[n-4]+x[n-5]-x[n-2])/L | |

FIXED LATENCY CONFIGURABLE TAP DIGITAL FILTER

TECHNICAL FIELD

The present disclosure relates generally to digital signal processing. Specifically, the present disclosure relates to a configurable digital filter with fixed latency.

BRIEF DESCRIPTION OF THE DRAWINGS

The written disclosure herein describes illustrative embodiments that are non-limiting and non-exhaustive. Reference is made to certain of such illustrative embodiments that are depicted in the figures described below.

DETAILED DESCRIPTION

Figure 1:
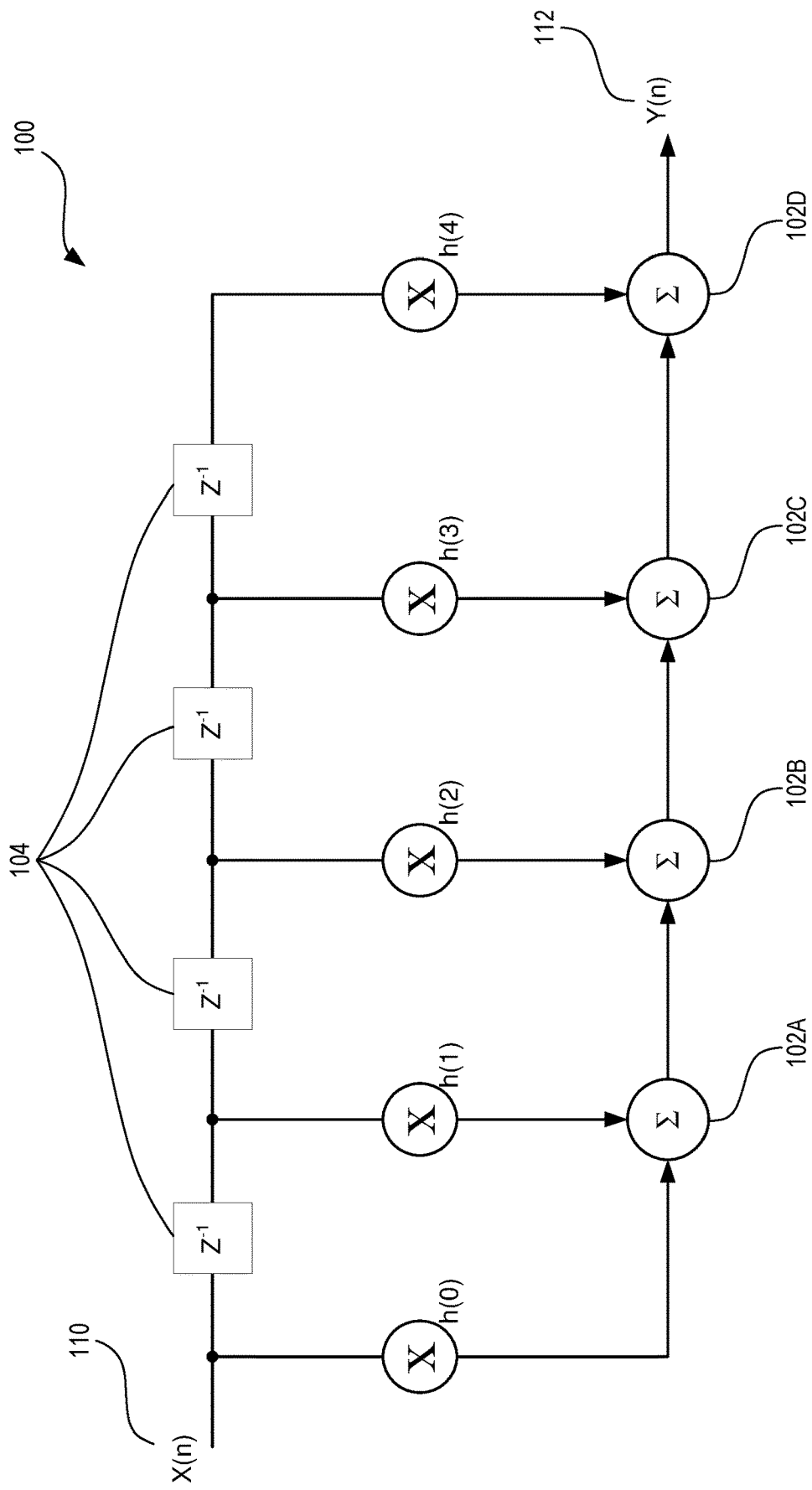
FIG. 1 is a representative view of one embodiment of a finite impulse response (FIR) filter.

Filters are widely used in signal processing and communication systems. Digital linear phase filters, such as finite impulse response (FIR) filters, are foundational components of many digital signal-processing systems. In signal processing, the filter applies mathematical calculations based on coefficient values of a sampled, discrete-time signal to remove unwanted parts of the signal, such as random noise, or to extract useful parts of the signal, such as the components within a certain frequency range. A FIR filter acquires a new data point of a waveform from each sampling period to generate an input signal with a discrete time sequence. The FIR filter outputs a discrete time sequence that is a convolution of the input sequence and the filter impulse response. Output data samples may be used to reconstruct an analog waveform with a low glitch digital-to-analog converter.

In some applications, the FIR filter must be able to operate at high sample rates. For example, in traveling wave based relay protection, a sample may be received every 1 µs (microsecond) at an input sample rate of 1 MHz (megahertz). The tap length of a FIR filter corresponds to the number of taps. A tap is a coefficient that is equal to the number of samples defining the length of the impulse response, and the number of taps is an indication of 1) the amount of memory required to implement the filter, 2) the number of calculations required, and 3) the amount of filtering the filter can do. In many implementations, to sustain a high incoming sample rate the FIR filter finishes processing an existing sample before receiving the next sample. Such FIR filters may exhibit a processing delay that increases as the number of taps increase. For example, if a series of samples are stored in a FPGA register that is clocked by a 125 MHz clock, it requires 8 ns (nanoseconds) to read a value. A filter with a length of 64 taps would result in a 512 ns delay. A 512 ns processing delay imposes limitations on the processing speed. For some uses, this delay may be too long. The delay will increase as the tap length increases, and as the delay increases, a traditional FIR filter may not be able to finish producing an output before receiving the next sample.

Isolation of a sample for a FIR filter may begin with a clock extractor that generates a differentiation signal based on the timing of oscillations of an incoming traveling wave. The differentiation signal may be amplified and sent to a clock generator. The clock generator may generate a clock signal that oscillates between a high and a low state for data signal sampling. The oscillating signal defines a plurality of clock periods. Each clock period may correspond with one of the clock's cycles. During each clock period a sample of the incoming traveling wave may be taken.

A FIR filter typically reads one sample value from an electric signal at a time. After a certain number of values are sampled, the values are then averaged together to produce an output. In some instances, averaging samples with a high number of taps may require multiple clock cycles resulting in processing delays. Thus, filters with large tap lengths may limit the maximum rate at which input samples can be processed.

The processing delay imposed by an increase in the number of taps on a typical FIR filter results in deviations from the otherwise periodic signal, which may cause jitter. Complications may arise if downstream consumers do not account for the jitter. Thus, a need exists for configurable digital tap filters with fixed latency irrespective of the number of taps. The fixed latency filters described herein allow data to be sampled and processed at a faster rate. Methods are also described herein for identifying an anomaly in a set of digitally sampled data values, using a fixed latency dynamic tap FIR filter.

A wide variety of sampling intervals may be defined by an internally generated or externally generated signal. For example, a fixed latency dynamic tap FIR filter may comprise a clock (or receive a clock signal) that outputs an oscillating signal that defines a plurality of clock periods as the sample period. A plurality of registers in a shift register may store digitally sampled data values, such as samples of an electrical signal at every sampling interval. The number of registers used by the filter may correspond to a desired tap length, L, set by a user. A first register may receive a new sample, x[n], at every sampling interval. At a first sampling interval, each register may store a current value. At the next sampling interval, when the first register receives a new sample, each register (including the first register) may transfer its currently stored value to a next register toward the last register. Thus, each sampled value will begin in a first register and, with each successive sampling interval, move through each of the intermediary registers until it is received by the last register. The last register shifts the sampled value out of the shift register to be either discarded or stored by another storage system.

An adder may subtract an oldest sample, x[n−L], stored in a last shift register from the new sample, x[n], stored in the first shift register to produce, determine, identify, or calculate ("generate") a difference during each clock period. An accumulator may add the difference to subsequent differences during each clock period and output an accumulation value (or "accumulation" for short). That is, the accumulation value is a sum of the difference generated by the adder during a previous sampling period and a sum of prior differences generate by the adder from even earlier sampling periods.

Figure 2A:
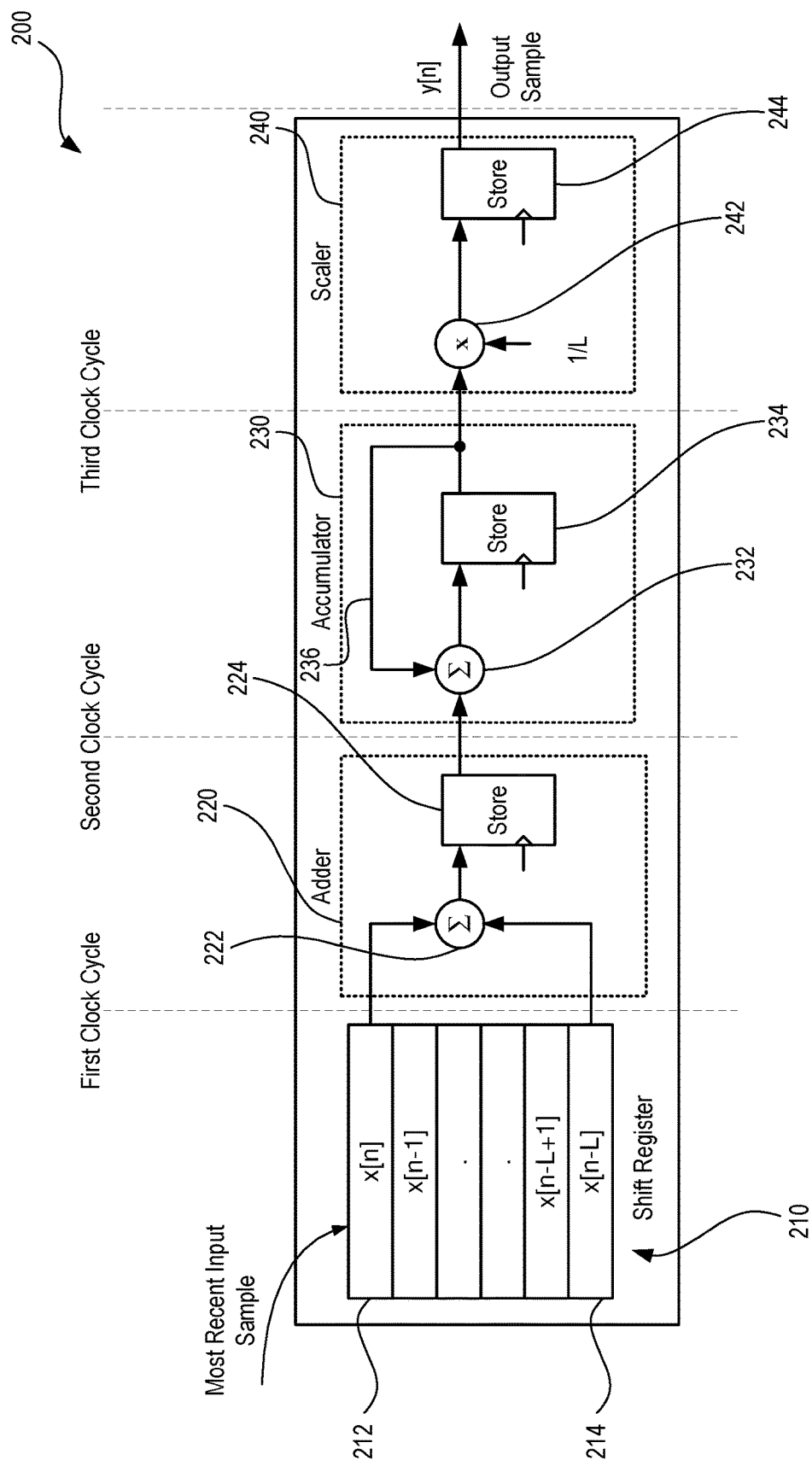
FIG. 2A is a simplified diagram of a fixed latency dynamic tap FIR filter, according to one embodiment.

Finally, a scaler may average the accumulation value by multiplying the accumulation by 1/L and output a filtered value, y[n]. In other embodiments, the scaler may "average" the accumulation value by multiplying the accumulation by 1/C, where C is any constant that is a function of the tap length, L, of the digital filter. In such embodiments, C may or may not be equal to L, and systems receiving the output value would interpret the output value based on the known constant C. The fixed latency dynamic tap FIR filter may produce an output regardless of the number of taps in a set number of clock cycles, as shown in FIG. 2A.

Many of the example embodiments relate to systems in which the filter taps have the same absolute value. However, alternative embodiments include systems that support different tap values. While this may increase the complexity of the system, it is understood that filtering using different tap values may be done using known algorithms. For simplicity, embodiments shown herein assume filter taps with the same absolute value.

In some embodiments, a fixed FIR filter with a fixed number of registers in a shift register, N, may be user-configurable for any number of taps up to N. If fewer taps are selected than N, the FIR filter may not use some of the registers in the shift register, or may use them all but prime a larger number of registers than would strictly be required. In other embodiments, the size of the shift register is dynamic and set during an initialization period to correspond (e.g., be equal to) the selected tap length.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

One or more of the described systems and methods may be implemented, monitored, and/or controlled by an intelligent electronic device (IED). As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like.

IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Aspects of certain embodiments described herein may be implemented as software modules or components. As used herein, a software module or component may include any type of computer instruction or computer-executable code located within or on a computer-readable storage medium. A software module may, for instance, comprise one or more physical or logical blocks of computer instructions, which may be organized as a routine, program, object, component, data structure, etc. that performs one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media.

Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network. In alternative embodiments, hardware and firmware may be utilized instead of software. For example, application specific control circuitry may be utilized to increase speed, efficiency, serviceability, and/or reduce maintenance costs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special-purpose processing device, such as an ASIC, PAL, PLA, PLD, CPLD, Field Programmable Gate Array (FPGA), or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following description of the embodiments of the systems and methods of the disclosure is not intended to limit the scope of the disclosure, as claimed, but is merely representative of possible embodiments.

FIG. 1 is a representative view of one embodiment of a FIR filter 100. Input samples, x(n), 110 are passed through a series of buffer registers or taps 104. A sample is stored in each of the taps 104 (four in this example), and these results are added together by a plurality of adders 102A, 102B, 102C, and 102D to yield an output, y(n), 112. To increase precision of the traditional FIR filter 100, the number of taps must be increased. As the number of taps increases, so do the number of adders and scalers. This increases the cost and complexity of the filter. Further, the additional adders and taps introduce added processing delay. As described herein, replacing the traditional FIR filter 100 with a fixed latency dynamic tap FIR filter allows for an increase in taps without a corresponding increase in cost, complexity, and processing delay.

FIG. 2A is a simplified diagram of a fixed latency dynamic tap FIR filter 200, according to one embodiment. The illustrated fixed latency dynamic tap FIR filter 200 includes a plurality of registers in a shift register 210, an adder circuit 220, an accumulator circuit 230, and a scaler circuit 240. Unlike the FIR filter in FIG. 1, that calculates a new average from all the samples each time a new sample is received, the fixed latency dynamic tap FIR filter 200 maintains an accumulated value of the most recent tap length values and scales the accumulated value to produce an output.

Each register in the shift register 210 may each store a signal sample. In various embodiments, the shift register 210 may be a cascade of flip-flop or latch circuits. During each sample period a first register 212 may receive a new sample, and each of the registers in the shift register 210 may output its current sample to a subsequent register causing the last register 214 to discard its sample. While the illustrated embodiment contemplates a shift register where each register "shifts" its values to an adjacent (either physically or by address) it is appreciated that registers may "shift" their values to non-adjacent registers (whether physically non-adjacent or address-non-adjacent).

In some embodiments, the fixed latency dynamic tap FIR filter 200 may utilize an initialization phase to fill all of the registers in the shift register 210. That is, the FIR filter 200 may initially prime the fixed latency dynamic tap FIR filter 200 prior to outputting a valid filtered value.

The adder circuit 220 may receive a value from the first register 212 and the last register 214. Once the number of samples equals or exceeds the number of registers in the shift register 210, an adder 222 may subtract the oldest sample stored in the shift register 210 to produce a difference. For example, as shown, the adder circuit 220 receives a value from the first register 212 and a second value from the last register 214. The adder circuit 220 would subtract the value in x[n−L] from the value stored in x[n]. The adder 222 may store the difference in an adder storage 224 until the next clock cycle. In one embodiment, the adder storage 224 may be a latch or a flip-flop. The difference stored may be overwritten each clock cycle.

The accumulator circuit 230 may receive the difference from the adder storage 224. The accumulator circuit 230 may accumulate the differences created by the adder circuit 220 each time a sample is received. The accumulator circuit 230 may include an adder 232, an accumulator storage 234, and a feedback loop 236. The adder 232 may sum the difference from the adder storage 224 and the value on the feedback loop 236. The accumulator storage 234 may store the sum until the next clock cycle. In one embodiment, the accumulator storage 234 may be a latch or a flip-flop. The difference stored may be overwritten each clock cycle. During each clock cycle, the value on the feedback loop 236 may be the sum of a preceding clock cycle. Thus, the accumulator circuit 230 may accumulate the current values of the samples.

The scaler circuit 240 receives the accumulated differences and scales the accumulated differences by a constant, $$\left(e.g., \frac{1}{L}\right).$$

The scaler circuit 240 may include a multiplier 242 and a scaler storage 244. The multiplier 242 may multiply the accumulated differences by the constant $$\left(\text{illustrated as } \frac{1}{L}\right).$$

The scaled output corresponds to a filtered value that can be output by the FIR filter.

In some embodiments, the fixed latency dynamic tap FIR filter 200 may be implemented in a field-programmable gate array (FPGA). In other embodiments, all or portions of the dynamic tap FIR filter may be implemented as discrete components, virtually, using a combination of hardware and software, or as an application specific integrated circuit (ASIC). In one embodiment, the adder circuit 220, the accumulator circuit 230, and the scaler circuit 240 may each require one clock cycle. Thus, the illustrated fixed latency dynamic tap FIR filter 200 requires only three clock cycles regardless of the number of taps. In the illustrated embodiment, the number of registers in the shift register 210 corresponds to the number of taps. This is a significant advantage over traditional FIR filters, such as the simple FIR filter 100 from FIG. 1, which may introduce an additional clock cycle for each tap.

In some embodiments the fixed latency dynamic tap FIR filter 200 may include an anomaly detector, which receives the filtered value, y[n], and is configured to identify one or more anomalies such as voltage spikes, open circuits, short circuits, etc.

Figure 2B:
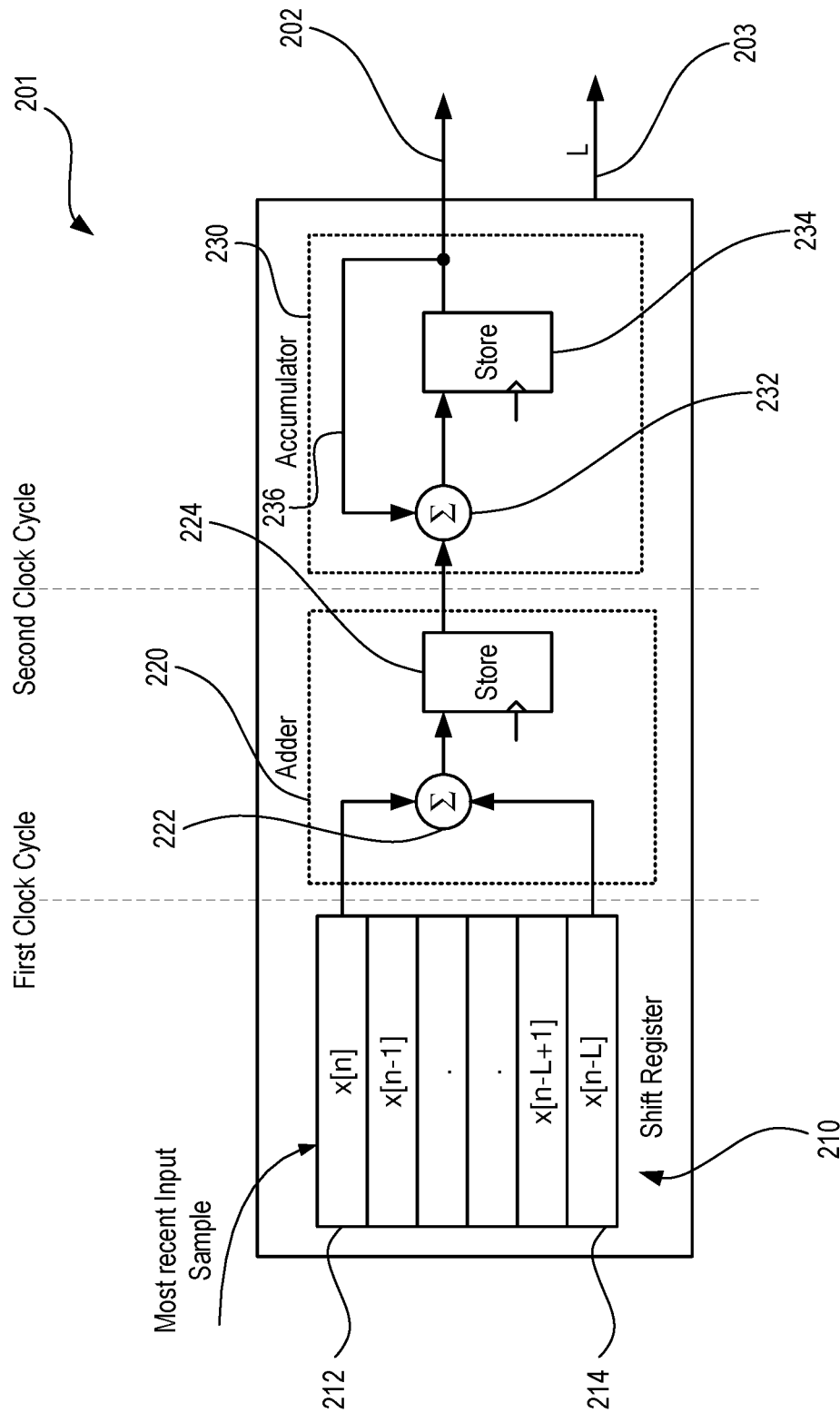
FIG. 2B is a simplified diagram of a fixed latency dynamic tap FIR filter, according to an alternative embodiment.

FIG. 2B is a simplified diagram of a fixed latency dynamic tap FIR filter 201, according to an alternative embodiment. In the illustrated embodiment, the scalar 240 in FIG. 2A is omitted. Accordingly, instead of outputting an average accumulation value, the FIR filter 201 may output, at 202, the accumulation value from the accumulator 230 and the tap length, L, at 203. In other embodiments, the tap length, L, may be known by a receiving system and so may not be output at all. In many embodiments using the system illustrated in FIG. 2B, the receiving system may divide the accumulation value by the known number of tap lengths, L, to produce a filtered value.

Figure 3:
FIG. 3 is a table listing a series of outputs from a three sample moving average FIR filter, according to one embodiment.

FIG. 3 is a table 300 listing an example of a series of outputs of a three sample moving average FIR filter using a fixed latency dynamic tap design similar to that shown in FIG. 2A. In FIG. 3, a running average is output with each new sample. The output may be from a three-tap fixed latency dynamic tap FIR filter. The first three samples may be taken before the three sample moving average FIR filter is primed. Upon receiving a fourth sample, the filter becomes primed causing the first sample value, x[n], to cancel out. As shown in bold below and bold and underlined in FIG. 3, the first sample is canceled out, resulting in:

$$y[n]=(x[n]+x[n-1]+x[n-2]+x[n-3]-x[n])/L.$$

Each sample received thereafter will cause the next oldest sample to cancel out to produce a running average. Thus, reception of a fifth sample cancels out the second sample, x[n−1], resulting in:

$$y[n]=(x[n-1]+x[n-2]+x[n-3]+x[n-4]-x[n-1])/L.$$

The process repeats upon reception of a sixth sample by canceling out the third sample, x[n−2], as shown in FIG. 3. Thus, regardless of the number of samples in the shift register, the latency remains fixed with a constant number of clock cycles. Again, such a FIR filter may be implemented in a programmable device, such as an FPGA or other device with similar capabilities.

Figure 4:
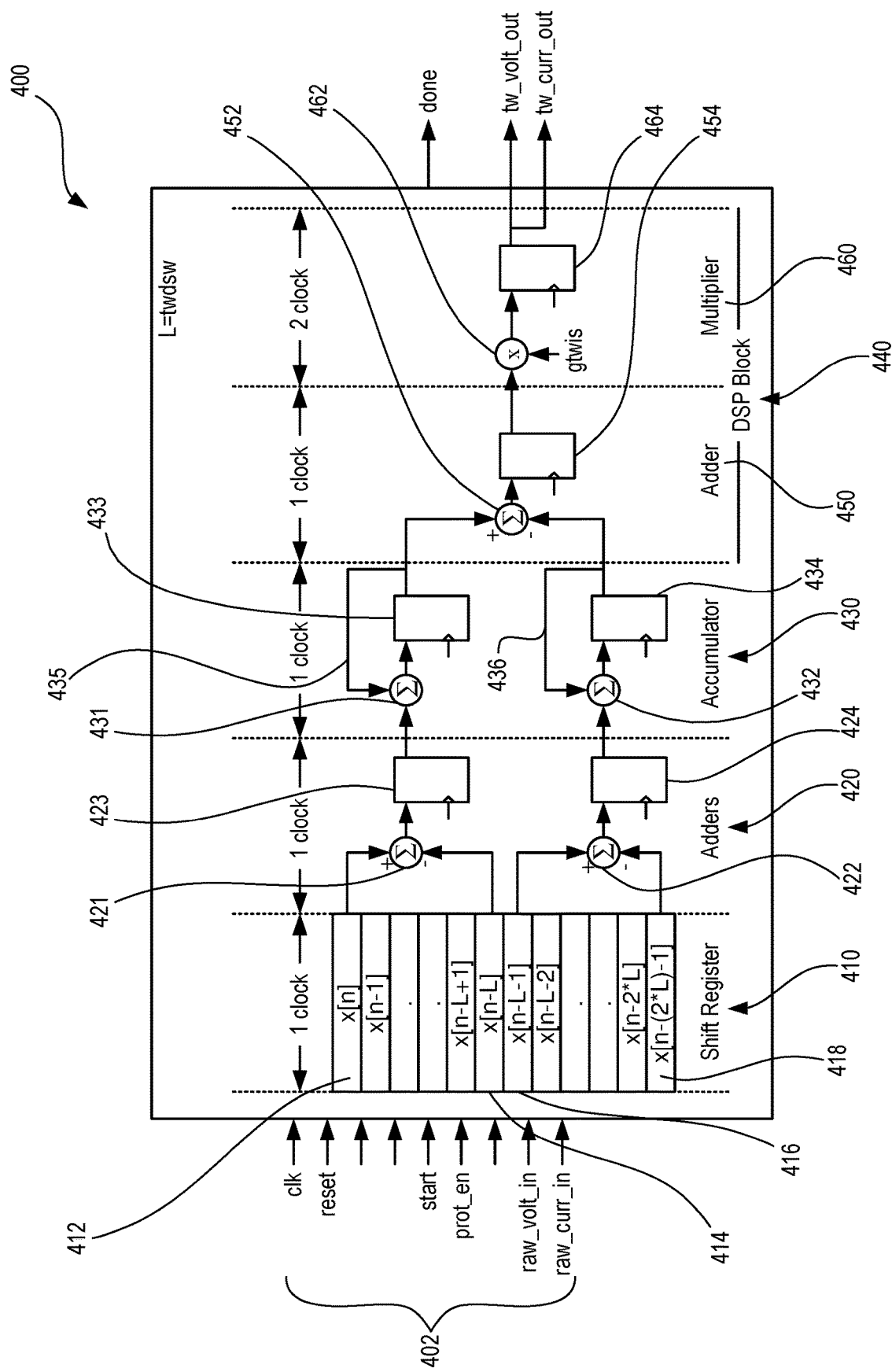
FIG. 4 is a fixed latency dynamic tap differentiator-smoother filter, according to one embodiment.

FIG. 4 is a fixed latency dynamic tap differentiator-smoother filter 400 using the same method as described in FIGS. 2 and 3, according to one embodiment. The fixed latency dynamic tap differentiator-smoother filter 400 may comprise one or more inputs 402, a plurality of registers in a shift register 410, an adder circuit 420, an accumulator circuit 430, a digital signal processing (DSP) block 440 further comprising a second adder circuit 450 and a multiplier circuit 460, and an output 408. The fixed latency dynamic differentiator-smoother filter 400 is able to maintain a fixed processing time regardless of the number of taps.

The inputs 402 may receive one or more settings, a clock, and/or traveling waves. The settings may enable the filter, indicate a window length, and/or indicate a gain factor. For example, the settings may indicate that a specified number of samples should be taken of the raw voltage or the raw current. Sampled bits of the raw voltage or current may be combined and extended to reach the specified number if the bit combination does not already equal the specified number of samples.

Each analog sample that is received may receive a time stamp. In one embodiment, multiple inputs 402 may enter the fixed latency dynamic differentiator-smoother filter 400 simultaneously for different settings or analog inputs. For example, the most recent input sample may enter a register buffer as new inputs, x[n] and x[n−L−1]. In one embodiment, the accumulator circuit 430 may maintain a running sum of positive input samples and a running sum of negative input samples.

The internal shift register 410 may store a maximum of 2*(L+1) input samples for performing the filter operation, where L equals half a window length of the differentiator-smoother. At a minimum, the half window length, L, may equal 2. The shift registers 410 may be a cascade of flip-flop or latch circuits. During each clock cycle a first register 412 may receive a new sample, x[n], and each of the registers in the shift register 410 may output their current sample to a subsequent register causing the shift register 410 to prime once all of the registers 410 are full. If there is more than one set of inputs, the process is repeated when a second new input, x[n−L−1], also enters the shift register buffer at a different register 416.

The adder circuit 420 may comprise two adders 421 and 422, and two adder storages 423 and 424. Once the shift register 410 is primed, one adder 421 receives positive sample values from the first 412 and last 414 registers of the first set of inputs. The other adder 422 receives negative sample values from the first 416 and last 418 registers of the second set of inputs when the shift register 410 for the second set of inputs are primed. If all of the registers in the shift register 410 are full, then the adders 421 and 422 may subtract the samples from the last registers 414 and 418 for each set of inputs that have been stored the longest.

For example, as shown, the first adder 421 of the adder circuit 420 would receive a value stored in x[n] from the first register 412 of the first set of inputs 404, and a second value stored in x[n−L] from the last register 414 of the first set of inputs 404. The adder 421 would add the values from x[n−L] to x[n]. Because one set of values is negative, it is effectively subtracted from the other. The adder circuit 420 may store the difference in an adder storage 423 until the next clock cycle. The second adder 422 receives a value stored in x[n−L−1] from the first register 416, which may account for a zero tap between positive and negative samples, and another value stored in x[n−(2*L)−1] from the last shift 418 of the second set of inputs 406. The adder circuit 420 may store the difference from the second set of inputs in another adder storage 424. The adder storage 424 may be a latch or a flip-flop, according to various embodiments. The differences stored may be overwritten each clock cycle.

An accumulator circuit 430 may receive the differences from the adder storages 423 and 424. The accumulator circuit 430 may accumulate the differences created by the adder circuit 420 each time a sample is received. The accumulator circuit 430 may include multiple adders 431 and 432, accumulator storages 433 and 434, and feedback loops 435 and 436.

The adders 431 and 432 may sum the difference from the corresponding adder storages 423 and 424 and the values on the feedback loops 435 and 436. For example, within the accumulator circuit 430, an adder 431 receives difference values from the adder storage 423 corresponding to the first set of inputs 404. The adder 431 sums the difference values with values received by a feedback loop 435. The sum obtained by the adder 431 is then stored in the accumulator storage 433 until the next clock cycle. The same process also occurs with difference values from the other adder storage 424. The accumulator adder 432 sums the difference values corresponding to the second set of inputs 406 with the values received from the second feedback loop 436. The accumulator circuit 430 stores the sums in the accumulator storage 434 until the next clock cycle. In one embodiment, the accumulator storages 433 and 434 may include a latch and/or a flip-flop. The difference stored may be overwritten each clock cycle. During each clock cycle, the value on the feedback loop 436 may be the sum of a preceding clock cycle. Thus, the accumulator circuit 430 may accumulate the current values of the samples. This running summation eliminates the need for the fixed latency dynamic differentiator-smoother filter 400 to perform 2*L number of additions with the reception of every new sample.

Once the differences are accumulated, the outputs of the accumulator circuit 430 then enter the DSP block 440. The DSP block 440 comprises the second adder circuit 450 and the multiplier circuit 460. The adder circuit 450 of the DSP block 440 includes an adder 452 that sums the two values from the accumulator storages 433 and 434. The value is then stored in an adder storage 454.

The illustrated embodiment includes multiplier circuit 460 in the DSP block 440 that includes a multiplier 462 and a multiplier storage 464. The multiplier 462 multiplies the value stored in the adder storage 454 by a gain factor. The multiplied value is then stored in the multiplier storage 464 before producing the output 408. Utilizing the fixed latency dynamic tap differentiator-smoother filter 400 to isolate a traveling wave may provide high pass filter performance. Once the traveling wave has been filtered, a smoothed average voltage and a smoothed average current value may be stored as data. The magnitude of the traveling may be used in fault computation algorithms. The output may be a high frequency traveling wave that is forwarded to other systems, such as a validation system as illustrated in FIG. 5.

Figure 5:
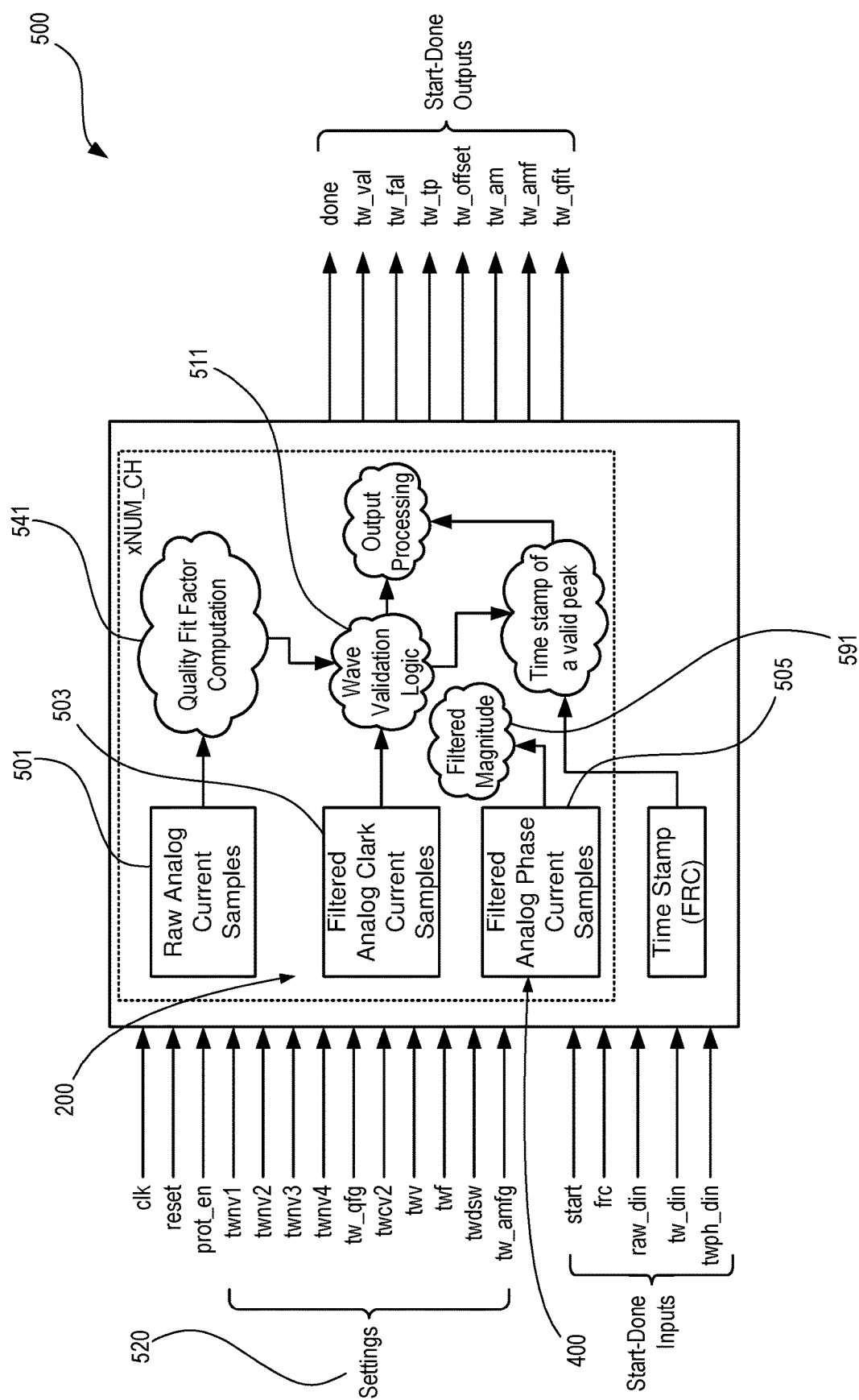
FIG. 5 is a block diagram of a wave validation system using a fixed latency dynamic tap FIR filter, according to one embodiment.

FIG. 5 is a block diagram of a wave validation system 500 using a fixed latency dynamic tap FIR filter, such as the embodiment illustrated in FIG. 2A. The wave validation system 500 may comprise a quality fit factor computation block 541 (see FIG. 7), a wave validation logic module 511 (see e.g., FIG. 6), the fixed latency dynamic differentiator-smoother filter 400 (see e.g., FIG. 4), and the fixed latency dynamic tap FIR filter 200 (see e.g., FIG. 2A). The wave validation system 500 may validate the sampled traveling waves and report any anomalies. The wave validation system 500 may also report valid and invalid traveling waves that are identified by providing an output that indicates the validity of the data and whether a certain anomaly occurred.

The wave validation system 500 may have multiple input settings 520, e.g. clock, reset, and protection settings, depending on the needs of the system. The wave validation system 500 may also receive an isolated traveling wave that has passed through a differential smoother filter, and associated raw analog current samples.

In some embodiments, the wave validation system 500 may compare three input samples. A first set of inputs may comprise raw analog current samples 501 data. A second set of inputs may include filtered analog Clark current samples 503 from a fixed latency dynamic tap FIR filter 200. A third set of inputs may include filtered analog phase current samples 505 from a fixed latency dynamic tap differentiator-smoother filter 400. The wave validation system 500 may maintain a local buffer holding the most recent samples (raw and filtered (phase and Clark)).

The wave validation system 500 may perform a traveling wave validation algorithm using each input simultaneously. The traveling wave validation algorithm may be performed on the filter data input for each phase. The traveling wave validation algorithm may detect a local peak value that is greater than the preceding and succeeding samples. For example, when validating a traveling current wave, the traveling wave validation system 500 may detect that a current sample was greater than a previous current sample.

The traveling wave validation algorithm may subject the raw analog current samples 501 to the quality fit factor computation block 541. The quality fit factor computation block 541 may determine whether there was a step change on the raw input data to be qualified as a valid step. The filtered analog Clark current samples 503 have been isolated by passing through a differentiator-smoother filter (e.g., fixed latency dynamic differentiator-smoother filter 400 of FIG. 4).

The wave validation logic module 511 receives the resulting output of the quality fit factor computation block 541 and the filtered analog Clark current samples 503. In various embodiments, the results of the wave validation logic may receive a time stamp of the valid peak before being processed as an output, or may be directly processed as an output. In one embodiment, a filtered magnitude module 591 may receive the filtered analog phase current samples 505. A fixed latency dynamic tap FIR filter may provide the filtered analog phase current samples 505 by maintaining a running average of samples in the shift register buffer. The outputs of the raw and filtered data may be updated according to any determinations made by the traveling wave validation algorithm.

Figure 6:
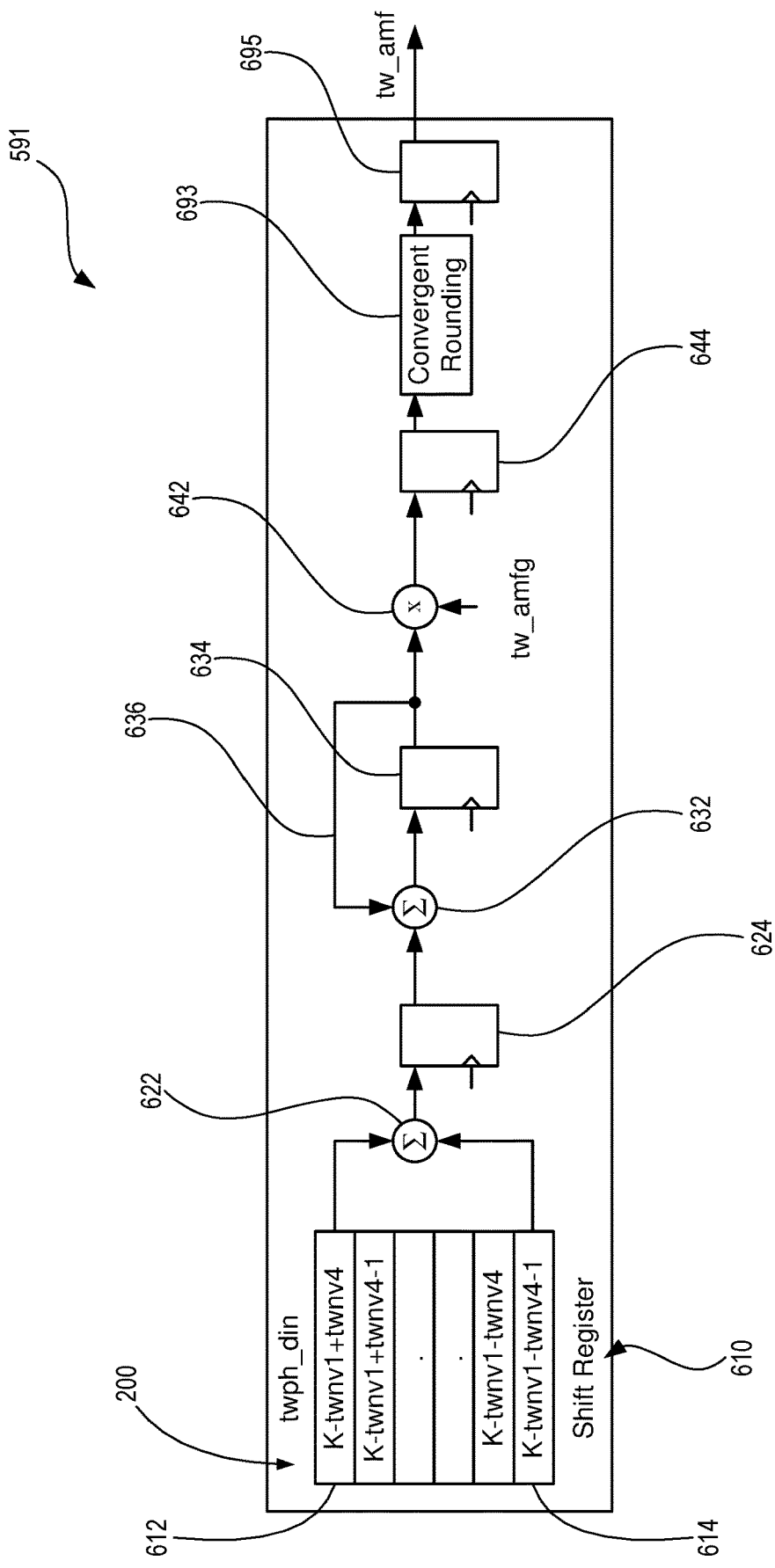
FIG. 6 is a diagram of the traveling wave filtered magnitude module of FIG. 5 using a fixed latency dynamic tap design, according to one embodiment.

FIG. 6 is a block diagram of the filtered magnitude module 591 of FIG. 5 using a fixed latency dynamic tap design, according to one embodiment. The filtered magnitude module 591 may comprise a plurality of registers in a shift registers 610 storing analog traveling wave phase current data, an adder 622, an adder storage 624, a second adder 632, an accumulator storage 634, a multiplier 642, a scaler storage 644, a convergent rounding block 693, and a convergent rounding block storage 695. The filtered magnitude module 591 filters the current in a fixed number of clock cycles regardless of how many shift registers are used implementing the methods described with reference to FIGS. 2 and 4.

The filtered magnitude module 591 may store a new analog traveling wave phase current data input array input, k. The first register 612 of the shift register 610 may receive a new input, k, during each clock cycle. Receiving a new data input causes the samples in each of the registers in the shift register 610 to shift to the next register. The shifting may result in the last register 614 discarding its sample. In some embodiments, each register in the shift register 610 stores a value (i.e., primed).

The adder 622 may receive a value from the first 612 and last 614 registers of the shift register 610. Once the number of samples equals or exceeds the number of registers in the shift register 610, the adder 622 may subtract the sample stored in the shift register 610 the longest (i.e., the oldest value in the shift register 610) to produce a difference. For example, as shown, the adder 622 would receive a value, k−twnv1+twnv4, from the first register 612 and a second value, k−twnv1−twnv4−1, from the last shift 614. The adder 622 would subtract k−twnv1−twnv4−1 from k−twnv1+twnv4. The adder 622 may store the difference in an adder storage 624 until the next clock cycle. In one embodiment, the adder storage 624 may be a latch or a flip-flop. The difference stored in the adder storage 624 may be overwritten each clock cycle.

The second adder 632 may sum the difference from the adder storage 624 and the value from a feedback loop 636. The accumulator storage 634 may store the resulting value until the next clock cycle. During each clock cycle, the value on the feedback loop 636 may be the sum of a preceding clock cycle. The multiplier 642 may then scale the output of the traveling wave filtered magnitude. The resulting value may then be stored in the scaler storage 644. The convergent rounding block 693 may perform a convergent rounding on the outputs of the scaler storage 644 to match the number format at the end of the processing chain. The rounded value may then be stored in the convergent rounding block storage 695 before providing a filtered magnitude module 591.

Figure 7:
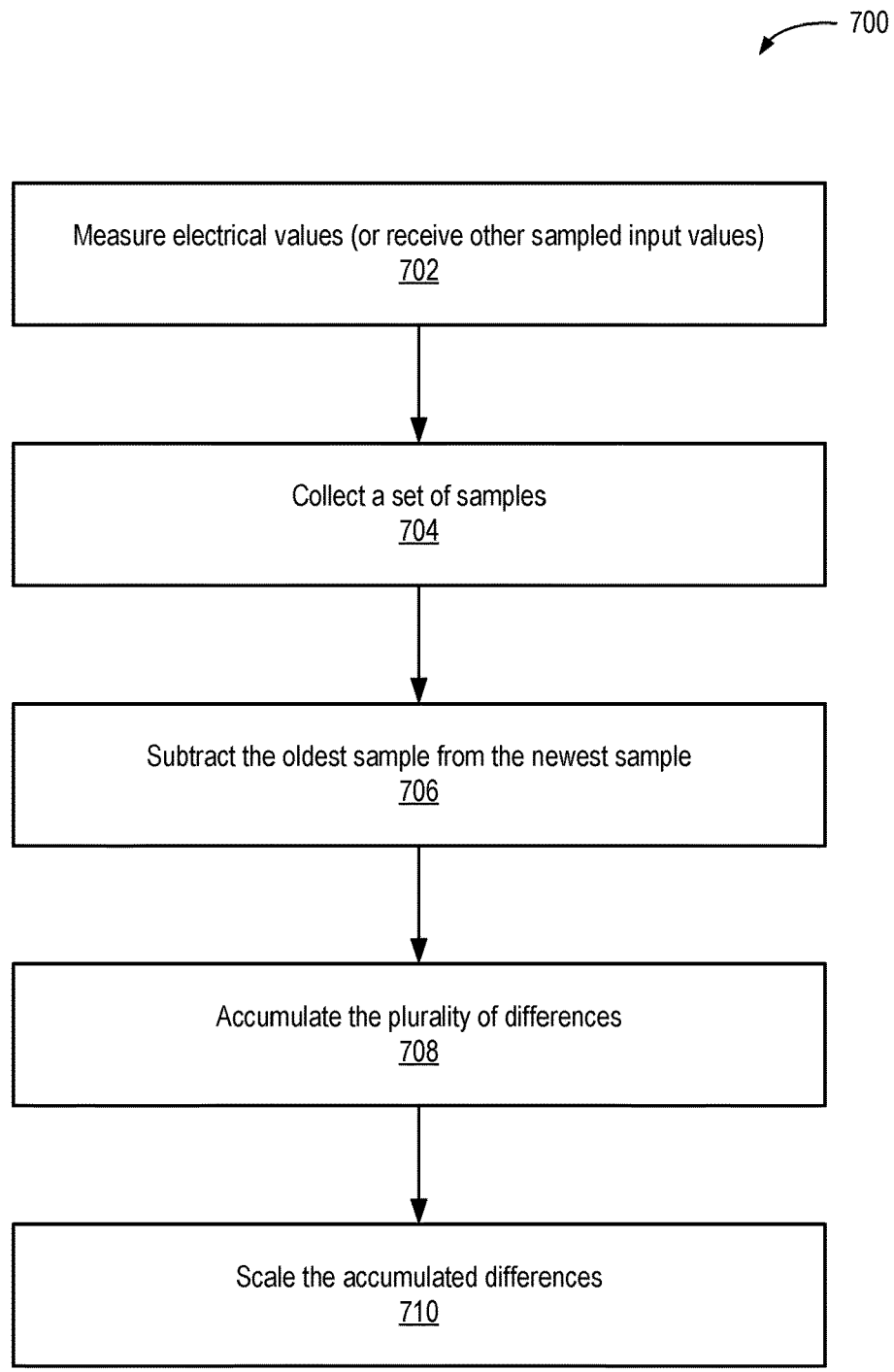
FIG. 7 is a flow chart of a method for filtering a signal, according to one embodiment.

FIG. 7 is a flow chart of a method 700 for filtering a signal, according to one embodiment. The method 700 may include measuring 702 electrical values of an electrical signal, or other sampled input value. The method 700 may also include collecting 704 a set of samples of the measured electrical values (or other sampled input values). The number of samples may correspond to a desired tap length, L. A new sample is periodically received and a previously oldest sample, x[n−L−1], is released from the set of samples when the new sample is received. The method may further include subtracting 706 the oldest sample, x[n−L], from the newest sample, x[n], to produce a difference each time the new sample is received, generating a plurality of differences. The method may include accumulating 708 the plurality of differences to produce an accumulation, and scaling 710 the accumulation by 1/L to produce a filtered value, y[n].

Figure 8:
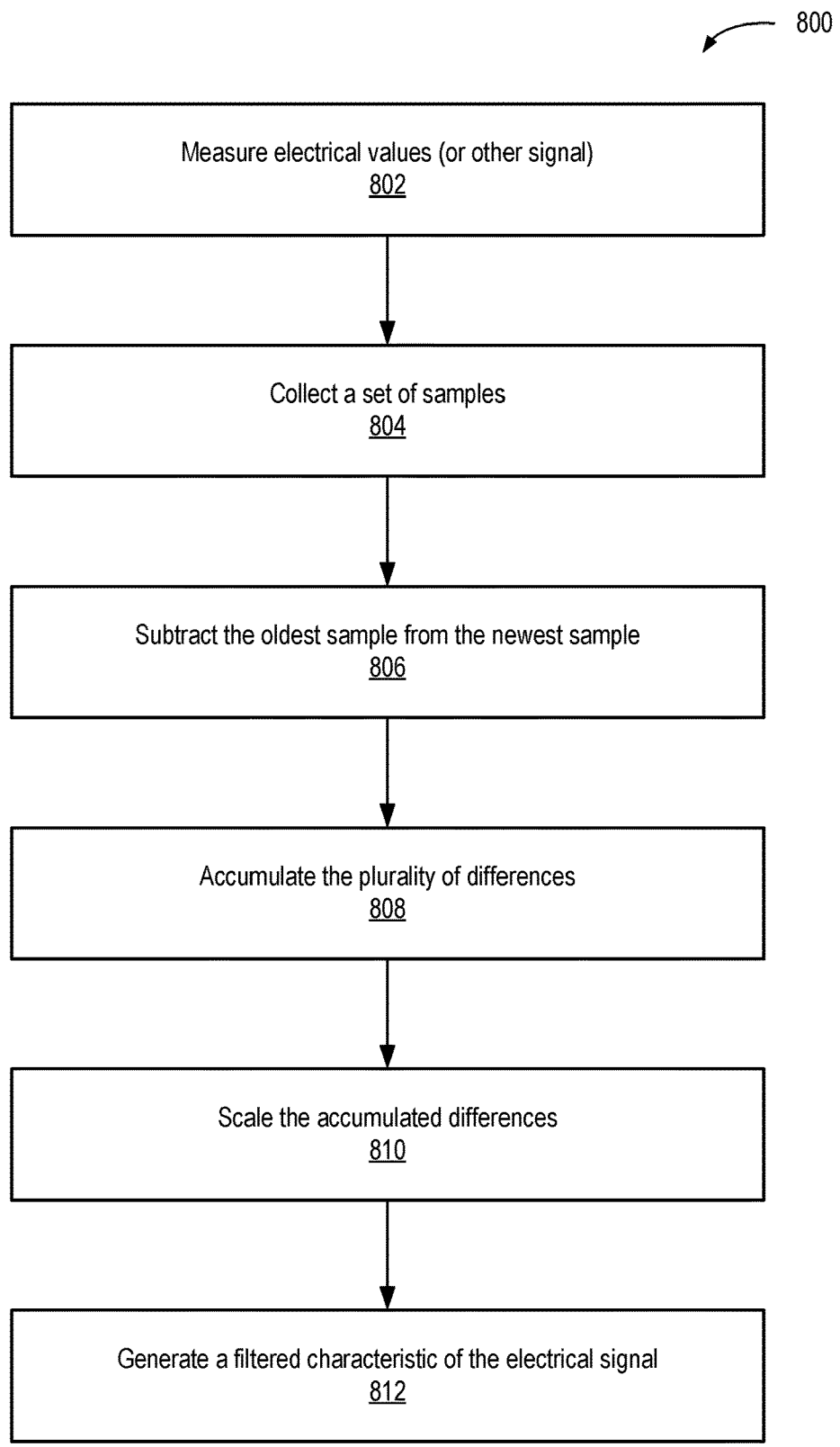
FIG. 8 is a flow chart of a method for identifying an anomaly in an electrical signal, according to one embodiment.

FIG. 8 is a flow chart of a method 800 for identifying an anomaly in an electrical signal (or other sampled signal), according to one embodiment. The method 800 may include measuring 802 electrical values of an electrical signal (or otherwise sample values of any other signal). The method 800 may also include collecting 804 a set of samples of the measured electrical values (or other sampled values), the number of samples corresponding to a desired tap length, L, wherein a new sample is periodically received and a previously oldest sample, x[n−L−1], is released from the set of samples when the new sample is received. The method may further include subtracting 806 the oldest sample, x[n−L], from the newest sample, x[n], to produce a difference each time the new sample is received, generating a plurality of differences. The method may include accumulating 808 the plurality of differences to produce an accumulation, and scaling 810 the accumulation by 1/L to produce a filtered value, y[n]. The method may also include generating 812 a filtered characteristic of the electrical signal using the filtered value, y[n]. An anomaly detector may use the filtered characteristic of the electrical signal to identify an anomaly.

In some embodiments, the method may involve establishing validation criteria based on the location of said anomaly. The method may also include receiving two or more inputs from raw and filtered data. In one embodiment, the method may include holding the most recent samples in a local buffer. The method may further comprise providing a time stamp for a valid peak, according to one embodiment. The method may also comprise performing a traveling wave validation algorithm simultaneously on the samples, computing a quality fit factor, and averaging the traveling wave samples that may result in producing a traveling wave filtered magnitude. In one embodiment, the method may include providing anomaly location information via an event report.

Any methods disclosed herein include one or more steps or actions for performing the described method. The method steps and/or actions may be interchanged with one another. In other words, unless a specific order of steps or actions is required for proper operation of the embodiment, the order and/or use of specific steps and/or actions may be modified and/or steps or actions may be omitted.

In some cases, well-known features, structures, or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations. Thus, all feasible permutations and combinations of embodiments are contemplated.

Several aspects of the embodiments described may be implemented, controlled, and/or monitored using software modules or components. As used herein, a software module or component may include any type of computer instruction or computer executable code located within a memory device and/or transmitted as transitory or non-transitory electronic signals over a system bus or wired or wireless network.

In the description above, various features are sometimes grouped together in a single embodiment, figure, or description thereof for the purpose of streamlining the disclosure. This method of disclosure, however, is not to be interpreted as reflecting an intention that any claim requires more features than those expressly recited in that claim. Rather, as the following claims reflect, inventive aspects lie in a combination of fewer than all features of any single foregoing disclosed embodiment. Thus, the claims are hereby expressly incorporated into this Detailed Description, with each claim standing on its own as a separate embodiment. This disclosure includes all permutations and combinations of the independent claims with their dependent claims.

It will be apparent to those having skill in the art that changes may be made to the details of the above-described embodiments without departing from the underlying principles of the invention. Embodiments of the invention in which an exclusive property or privilege is claimed are defined as follows.

What is claimed is:

1. A configurable digital filter with a fixed latency comprising:
   a shift register to store sampled values, the number of registers used in the shift register corresponding to a selected tap length, L, of the digital filter,
   wherein the shift register including at least a first register, a plurality of intermediary registers, and a last register, and
   wherein, for each sampling interval of the digital filter, the first register receives a new sampled value and each of the stored sampled values in the shift register are shifted, such that after a plurality of sampling intervals each sampled value is shifted from the first register, through the plurality of intermediary registers, to the last register;
   an adder to generate a difference between a sampled value stored in the last shift register and a sampled value stored in the first register during each sampling interval;
   an accumulator that, for each sampling period, generates an accumulation value by adding a difference generated by the adder during a previous sampling period to a sum of prior differences generated by the adder;
   a scaler to generate a filtered value output by multiplying the accumulation value by 1/C, where C is a constant; and
   an anomaly detector within the digital filter to identify an anomaly in a system being sampled by the digital filter by comparing one or more filtered value outputs with at least one of: filtered value outputs from previous sampling periods and unfiltered sampled values.

2. The digital filter of claim 1, wherein the constant, C, is equal to the tap length, L, such that the digital filter is a moving average digital filter.

3. The digital filter of claim 1, wherein the sampled values comprise sampled values from an electrical power line.

4. The digital filter of claim 1, further comprising a clock to provide a timing signal that defines the sampling interval of the digital filter.

5. The digital filter of claim 1, wherein the anomaly detector is configured to identify at least one of a voltage spike, an open circuit, and a short circuit.

6. The digital filter of claim 1, further comprising a validation criteria module wherein the validation module identifies a location of the anomaly using a traveling wave validation algorithm.

7. The filter of claim 1, wherein the filter is operatively connected to an intelligent electronic device that receives measurements associated with one or more traveling waves.

8. A digital filter with a fixed latency comprising:
   a timing component to define a sampling period for the digital filter based on a timing signal;
   a shift register to store sampled values, the number of registers in the shift register being no less than a selected number of taps (tap length), L, of the digital filter,
   wherein, for each sampling period the shift register shifts sampled values through the shift register, such that after a number of sampling periods corresponding to the tap length, L, each sampled value is shifted from a first register, sequentially through each of a plurality of intermediary registers, to a last register;
   an adder to generate a difference between a sampled value stored in the last shift register and a sampled value stored in the first register during each sampling interval;
   an accumulator that, for each sampling period, generates an accumulation value by adding a difference generated by the adder during a previous sampling period to a sum of prior differences generated by the adder;

an anomaly detector within the digital filter to identify an anomaly in a system being sampled by the digital filter by comparing one or more filtered value outputs with at least one of: filtered value outputs from previous sampling periods and unfiltered sampled values; and an output component to output the accumulation value.

9. The digital filter of claim 8, wherein the output component further outputs the tap length, L.

10. The digital filter of claim 8, wherein the timing component is an input component to receive the timing signal from an external clock source.

11. The digital filter of claim 8, further comprising a scaler component to generated a filtered value output by multiplying the accumulation value by 1/C, where C is a constant corresponding to the tap length, L.

12. The digital filter of claim 8, further comprising a validation criteria module wherein the validation module identifies a location of the anomaly using a traveling wave validation algorithm.

13. The digital filter of claim 8, wherein the digital filter is integrated within an intelligent electronic device (IED) that that provides at least one of monitoring control and protection control for an electrical distribution system.

14. A method for generating a fixed-latency filtered output via a configurable FIR filter, comprising:

determining a difference, via an adder, between an oldest sampled value and a newest sampled value within a data store at an Nth sampling interval, where N is an integer corresponding to a tap length, L, selected for the configurable FIR filter, wherein the data store includes a number of sampled values corresponding to the tap length, L, including a most recent sampled value, a plurality of intermediary sampled values, and an oldest sampled value;

determining an accumulation value by adding the difference determined by the difference adder at the Nth sampling interval to a summation of differences determined by the adder for a plurality of sampling intervals prior to the Nth sampling interval;

scaling the accumulation value by multiplying it by 1/C to produce a filtered value, where C is a constant;

determining a filtered characteristic associated with the sampled values based on an analysis of at least one produced filtered value; and identifying an anomaly in the sampled values based on at least one of: the determined filtered characteristic, a plurality of filtered values determined at each of a plurality of sampling intervals, and raw unfiltered sampled values at each of the plurality of sampling intervals.

15. The method of claim 14, further comprising initialization phase to prime the configurable FIR filter, comprising:

identifying a selection of the tap length, L, for the configurable FIR filter;

sampling an electrical component to generate a sampled value for each of a number of sampling intervals corresponding to the tap length, L; and storing the sampled values in the data store, including the most recent sampled value, the plurality of intermediary sampled values, and the oldest sampled value.

16. The method of claim 14, further comprising:

identifying an anomaly in the sampled values based on the determined filtered characteristic; and identifying a location of the anomaly via a traveling wave validation algorithm.

17. The method of claim 14, further comprising:

determining a filtered characteristic associated with the sampled values based on an analysis of at least one produced filtered value;

identifying an anomaly in the sampled values based on the determined filtered characteristic; and generating an event report identifying the anomaly in the sampled value.

* * * * *